United States Patent
Heo et al.

(10) Patent No.: US 10,910,794 B2
(45) Date of Patent: Feb. 2, 2021

(54) LIGHT-EMITTING DEVICE COMPRISING PHOTONIC CAVITY

(71) Applicants: Samsung Electronics Co., Ltd., Suwon-si (KR); President and Fellows of Harvard College, Cambridge, MA (US)

(72) Inventors: Jinseong Heo, Seoul (KR); Minhyun Lee, Yongin-si (KR); Seongjun Park, Seoul (KR); Philip Kim, Cambridge, MA (US); Hongkun Park, Cambridge, MA (US); Donhee Ham, Cambridge, MA (US)

(73) Assignees: Samsung Electronics Co., Ltd., Gyeonggi-do (KR); President and Fellows of Harvard College, Cambridge, MA (US)

( * ) Notice: Subject to any disclaimer, the term of this patent is extended or adjusted under 35 U.S.C. 154(b) by 48 days.

(21) Appl. No.: 15/962,600

(22) Filed: Apr. 25, 2018

(65) Prior Publication Data

US 2019/0013648 A1 Jan. 10, 2019

Related U.S. Application Data

(60) Provisional application No. 62/528,473, filed on Jul. 4, 2017.

(30) Foreign Application Priority Data

Dec. 4, 2017 (KR) .......................... 10-2017-0165230

(51) Int. Cl.
*H01S 5/30* (2006.01)
*H01S 5/10* (2006.01)
(Continued)

(52) U.S. Cl.
CPC ............ *H01S 5/3095* (2013.01); *H01L 33/00* (2013.01); *H01L 33/0045* (2013.01);
(Continued)

(58) Field of Classification Search
CPC ...... H01S 5/3095; H01S 5/323; H01S 5/0424; H01S 5/105; H01S 5/0425; H01S 5/06203; H01L 33/0045; H01L 33/00
See application file for complete search history.

(56) References Cited

U.S. PATENT DOCUMENTS 7,206,488 B1 * 4/2007 Altug .................... B82Y 20/00
385/129
9,236,540 B2 1/2016 Reboud et al.
(Continued)

OTHER PUBLICATIONS

Fengnian Xia et al., "Two-Dimensional Material Nanophotonics", "Nature Photonics 8 (12)", p. 899.
(Continued)

*Primary Examiner* — Yuanda Zhang
(74) *Attorney, Agent, or Firm* — Harness, Dickey & Pierce, P.L.C.

(57) ABSTRACT

A light-emitting device includes a substrate including a photonic cavity and configured to function as a gate, an active layer including a two-dimensional material, a first conductive contact, and a second conductive contact. The wavelength range of light generated by the light-emitting device may be narrowed based on the photonic cavity being included in the substrate, and the intensity and wavelength range of the generated light may be controlled based on the substrate functioning as a gate.

22 Claims, 4 Drawing Sheets

(51) Int. Cl.
    *H01S 5/042* (2006.01)
    *H01S 5/323* (2006.01)
    *H01L 33/00* (2010.01)
    *H01S 5/062* (2006.01)

(52) U.S. Cl.
    CPC ............ *H01S 5/0424* (2013.01); *H01S 5/323* (2013.01); *H01S 5/04253* (2019.08); *H01S 5/04257* (2019.08); *H01S 5/06203* (2013.01); *H01S 5/105* (2013.01)

(56) References Cited

U.S. PATENT DOCUMENTS

| | | | | |
|---|---|---|---|---|
| 2011/0280269 | A1* | 11/2011 | Chang-Hasnain | H01S 5/105 372/50.1 |
| 2014/0231758 | A1* | 8/2014 | Mok | H01L 51/5296 257/40 |
| 2014/0348195 | A1* | 11/2014 | Sakaguchi | H01S 5/105 372/45.01 |
| 2016/0248224 | A1* | 8/2016 | Noda | H01S 5/0425 |
| 2017/0018902 | A1 | 1/2017 | Kim et al. | |
| 2017/0110338 | A1* | 4/2017 | Amani | H01L 21/465 |
| 2019/0097391 | A1* | 3/2019 | Reboud | H01S 5/3027 |

OTHER PUBLICATIONS

Dehui Li et al., "Electric-Field-Induced Strong Enhancement of Electroluminescence in Multilayer Molybdenum Disulfide", "Nature Communications", 2015, pp. 7509.

Sangfent Wu et al., "Monolayer Semiconductor Nanocavity Lasers with Ultralow Thresholds", "Nature-Letter", Nature 2015, 520. 7595, p. 69.

Yuanfang Yu et al., "Photodetecting and Light-Emitting Devices Bases on Two Dimensional Materials", Chinese PhysicsB26.3 (2017):036801, 2017, pp. 1-14.

* cited by examiner

LIGHT-EMITTING DEVICE COMPRISING PHOTONIC CAVITY

CROSS-REFERENCE TO RELATED APPLICATIONS

This application claims the benefits of Korean Patent Application No. 10-2017-0165230, filed on Dec. 4, 2017, in the Korean Intellectual Property Office, and U.S. Provisional Application Ser. No. 62/528,473, filed on Jul. 4, 2017, in the U.S. PTO, the disclosures of each of which are incorporated herein in their entirety by reference.

BACKGROUND

1. Field

The present disclosure relates to light-emitting devices including a photonic cavity.

2. Description of the Related Art

Light-emitting devices using III group to V group materials according to the prior art have weak light matter interaction and thus have a low light absorption coefficient. As a result, it may be difficult to grow said materials to a large scale and to be transferred to a desired substrate for incorporation in one or more light-emitting devices.

To overcome the above problems, there has been a trial to replace the III group to V group materials with two-dimensional materials. Light-emitting devices including two-dimensional materials have strong light matter interaction characteristics and are easy to grow to a large scale, compared to the prior art. Also, light-emitting devices having two-dimensional materials may be configured to emit light in a wide optical spectrum ("wavelength range") from an infrared ray to an ultraviolet ray. However, light-emitting devices having two-dimensional materials may be associated with a decrease in light efficiency due to indirect bandgap and a decrease in light efficiency due to various defects. In particular, when a two-dimensional material has indirect bandgap, it is a problem that the light-emitting device generates light of a wider wavelength range than is necessary.

SUMMARY

Provided are light-emitting devices including a photonic cavity.

Additional aspects will be set forth in part in the description which follows and, in part, will be apparent from the description, or may be learned by practice of the presented example embodiments.

According to some example embodiments, a light-emitting device may include a substrate including a photonic cavity, an active layer on the photonic cavity, the active layer including a two-dimensional material, a first conductive contact electrically connected to the active layer, and a second conductive contact electrically connected to the active layer.

The light-emitting device may include a tunneling layer between the first and second conductive contacts and the active layer, the tunneling layer contacting each of the first conductive contact, the second conductive contact, and the active layer.

The tunneling layer may include a first tunneling layer between the first conductive contact and the active layer, the first tunneling layer contacting both the first conductive contact and the active layer, and a second tunneling layer between the second conductive contact and the active layer, the second tunneling layer contacting both the second conductive contact and the active layer.

The tunneling layer may at least partially surround the active layer.

The second conductive contact may be on an upper surface of the tunneling layer, and the first conductive contact may contact a side surface of the tunneling layer.

The light-emitting device may include a transparent electrode contacting the second conductive contact, the transparent electrode extending in a direction that is perpendicular to an upper surface of the substrate.

The light-emitting device may include an insulating layer between the first conductive contact and the substrate.

The light-emitting device may include an insulating layer between the active layer and the substrate, the insulating layer configured to electrically insulate the active layer from the substrate.

The insulating layer may have a non-uniform thickness.

The insulating layer may include a first portion between the first conductive contact and the substrate, the first portion having a first thickness in a direction that is perpendicular to an upper surface of the substrate, and a second portion between the second conductive contact and the substrate, the second portion having a second thickness in the direction that is perpendicular to the upper surface of the substrate, the second thickness greater than the first thickness.

The insulating layer may include a first insulating layer on the substrate, and a second insulating layer on a limited portion of a surface of the first insulating layer.

The active layer may include a first conductive active layer contacting the first conductive contact and not contacting the second conductive contact, and a second conductive active layer contacting the second conductive contact and not contacting the first conductive contact.

The active layer may include a layered structure, the layered structure including the first conductive active layer and the second conductive active layer.

The light-emitting device may include a tunneling layer, the tunneling layer including a first tunneling layer between the first conductive contact and the first conductive active layer, and a second tunneling layer between the second conductive contact and the second conductive active layer.

The light-emitting device may include a first tunneling layer on the photonic cavity, the first tunneling layer contacting the first conductive contact, wherein the active layer is on the first tunneling layer.

The active layer may include a first conductive active layer on the first tunneling layer, and a second conductive active layer stacked on the first conductive active layer, the second conductive active layer contacting the second conductive contact.

The light-emitting device may include an insulating layer on the substrate, the insulating layer contacting the first tunneling layer and the first conductive active layer at a side surface of the insulating layer, the insulating layer contacting the second conductive active layer at an upper surface of the insulating layer.

The light-emitting device may include a second tunneling layer between the second conductive contact and the active layer.

The substrate may at least partially include a conductive material.

The two-dimensional material may be transition metal dichalcogenide (TMD).

The photonic cavity may be configured to function as a gate electrode.

According to some example embodiments, a laser light source may include the light-emitting device.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
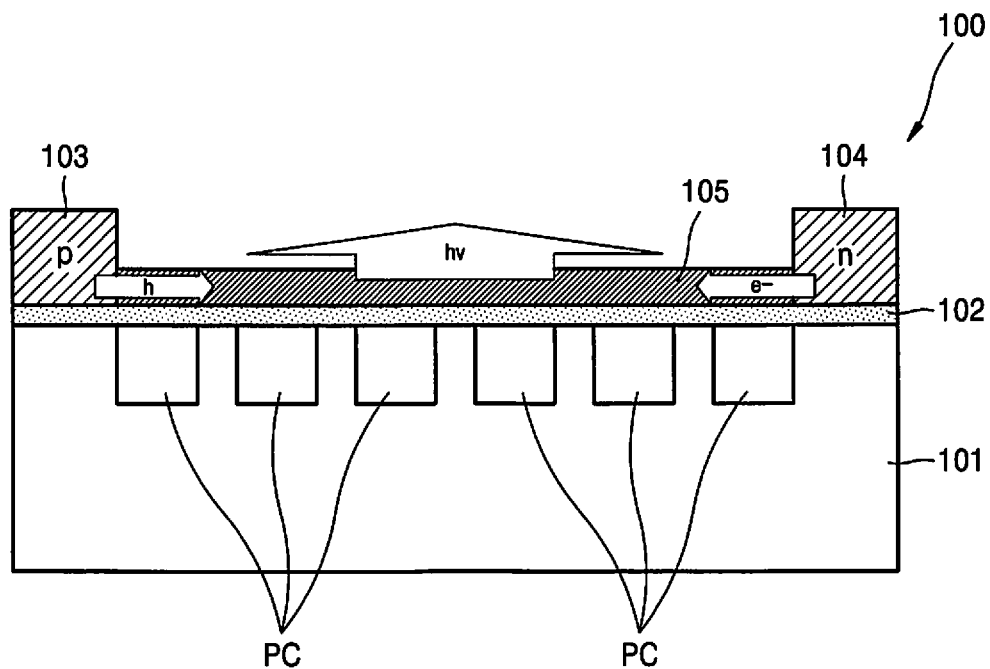
FIG. 1 is a schematic cross-sectional view of a light-emitting device according to some example embodiments.

Hereinafter, light-emitting devices according to some example embodiments are described in detail with reference to the accompanying drawings. In the drawings, widths and thicknesses of layers or regions may be exaggerated to a degree for clarity of the specification and for convenience of description. Throughout the detailed description section of the present disclosure, like reference numerals denote like constituent elements.

The terms used in the present disclosure have been selected from currently widely used general terms in consideration of the functions in the present disclosure. However, the terms may vary according to the intention of one of ordinary skill in the art, case precedents, and the advent of new technologies. Also, for special cases, meanings of the terms selected by the applicant are described in detail in the description section. Accordingly, the terms used in the present disclosure are defined based on their meanings in relation to the contents discussed throughout the specification, not by their simple meanings.

While such terms as "first," "second," etc., may be used to describe various components, such components must not be limited to the above terms. The above terms are used only to distinguish one component from another.

As used herein, the singular forms "a," "an" and "the" are intended to include the plural forms as well, unless the context clearly indicates otherwise.

When a part may "include" a certain constituent element, unless specified otherwise, it may not be construed to exclude another constituent element but may be construed to further include other constituent elements.

FIG. 1 is a schematic cross-sectional view of a light-emitting device 100 according to some example embodiments. Referring to FIG. 1, the light-emitting device 100 may include a substrate 101 including a photonic cavity (PC), an insulating layer 102, a first conductive contact 103, a second conductive contact 104, and an active layer 105.

The first conductive contact 103 and the second conductive contact 104 may each be electrically connected to the active layer 105.

The substrate 101 may include the PC in a surface thereof. The PC signifies an empty space formed in the surface of the substrate 101. For example, the PC may be formed by etching the surface of the substrate 101. The PC may have a dimensional component corresponding to a wavelength range of light to be formed ("generated," "emitted," etc.) by the light-emitting device 100. For example, when the light-emitting device 100 is to generate light having a range of several hundreds of nanometers, the width of each PC may be in a range of about several hundreds of nanometers. The height of the PC is not specifically limited and may be from about 1 um to about 1 nm. The PC may include a plurality of PCs. The PCs may be spaced apart from each other by a uniform interval. For example, although the PCs may be arranged to have a hexagonal pattern, the present disclosure is not limited thereto. The PC may have various shapes such as a circular column or a rectangular column. The PC may increase intensity of light generated by optical coupling with the active layer 105 or may increase photoelectric conversion efficiency. The PC may function as an electrode. For example, the PC may be configured to function as a gate electrode. The PC may be formed of a material that does not absorb a wavelength corresponding to a resonance wavelength of the light-emitting device 100.

The substrate 101 may be formed of ("may at least partially include") a conductive material. For example, the substrate 101 may be formed of metal. For example, the substrate 101 may be formed of a material such as Pd, Pt, Ru, Au, Ag, Mo, Mg, Al, W, Ti, Ir, Ni, Cr, Nd, or Cu. For example, the substrate 101 may use graphene or a transparent conductive metal oxide such as an indium tin oxide (ITO), an indium zinc oxide (IZO), an aluminum zinc oxide (AZO), or a gallium zinc oxide (GZO). Considering the wavelength of light generated from the active layer 105, the substrate 101 may be formed of a material having a low light absorption rate with respect to the wavelength.

The insulating layer 102 may be formed on the substrate 101. For example, the insulating layer 102 may be formed of a gate insulating film material of a general semiconductor transistor such as $SiO_2$, SiNx, $FO_2$, $Al_2O_3$, $La_2O_3$, $ZrO_2$, HfSiO, HfSiON, HfLaO, LaAlO, or SrTiO. As shown in at least FIG. 1, the insulating layer 102 may be between the active layer 105 and the substrate 101, and the insulating layer 102 may be configured to electrically insulate the active layer 105 from the substrate 101.

When one of the first conductive contact 103 and the second conductive contact 104 is formed as a transparent electrode, the other may be formed of an over-doped semiconductor. Alternatively, the first conductive contact 103 and the second conductive contact 104 may be formed of a metal material. The first conductive contact 103 and the second conductive contact 104 may be provided on the insulating layer 102 to be spaced apart from each other. For example, the first conductive contact 103 and the second conductive contact 104 may be provided not to vertically cover the PC.

The active layer 105 may be formed of ("may at least partially include") a two-dimensional material. The two-dimensional material may be a transition metal dichalcogenide (TMD). The active layer 105 may be formed of, for example, graphene, black phosphorus, or hexagonal boron nitride (hBN). For example, the active layer 105 may be formed of transition metal dichalcogenide including $MoS_2$, $MoSe_2$, $MoTe_2$, $WS_2$, $WSe_2$, or $WTe_2$. The active layer 105 may be and/or include a transition metal dichalcogenide (TMD) monolayer. When the active layer 105 is formed of a TMD monolayer, the active layer 105 has direct bandgap characteristics, and thus energy efficiency of a light-emitting device may be improved. However, the present disclosure is not limited thereto, and the active layer 105 may have a dichalcogenide bilayer or multilayer structure. A resonant wavelength of the light-emitting device 100 may be defined according to the optical bandgap and optical spectrum of the active layer 105. The active layer 105 may be a quantum-dot film or may be formed of III to V group materials. The thickness of the active layer 105 may be about 1 nm to about 1 um.

The light-emitting device 100 according to some example embodiments may have a horizontal p-i-n structure. Referring to FIG. 1, the first conductive contact 103 and the second conductive contact 104 may contact both side surfaces of the active layer 105. In the above structure, when a voltage is applied to the first conductive contact 103 and the second conductive contact 104, a first conductive region (p or n), a depletion layer region (i), a second conductive region (n or p) may be sequentially formed in the horizontal direction with respect to the active layer 105.

The light-emitting device 100 according to some example embodiments may be driven by applying a bias voltage Vbias to the second conductive contact 104 by using, for example, the first conductive contact 103, as a ground electrode GND. The driving characteristics of the light-emitting device 100 may be controlled by a gate voltage Vgate applied to the substrate 101. In the light-emitting device 100 according to some example embodiments, since the substrate 101 is configured to function as the gate electrode, the characteristics, that is, intensity or wavelength range, of the light generated from the light-emitting device 100 may be easily changed. Furthermore, light in a narrow wavelength range may be generated from the light-emitting device 100 due the PC provided in to the substrate 101. Restated, the wavelength range of light generated by the light-emitting device 100 may be narrowed ("decreased," "reduced," etc.) based on the photonic cavity PC included in the substrate 101. The driving method may be commonly applied not only to the light-emitting device 100, but also to all embodiments described later.

Figure 2:
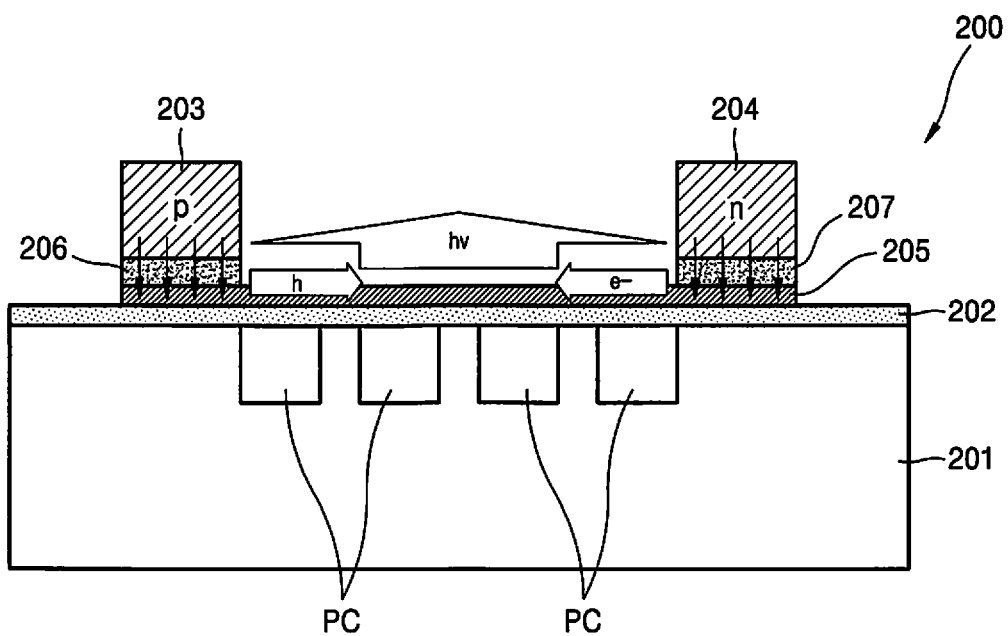
FIG. 2 is a schematic cross-sectional view of a light-emitting device according to some example embodiments.

FIG. 2 is a schematic cross-sectional view of a light-emitting device 200 according to some example embodiments. Referring to FIG. 2, the light-emitting device 200 may include a substrate 201 including the PC, an insulating layer 202, a first conductive contact 203, a second conductive contact 204, an active layer 205, and first and second tunneling layers 206 and 207.

Since the characteristics and compositions of the substrate 201, the insulating layer 202, the first conductive contact 203, the second conductive contact 204, and the active layer 205 are already described with regard to the example embodiments illustrated in FIG. 1, redundant descriptions thereof are omitted.

The first and second tunneling layers 206 and 207 may be respectively provided between the first and second conductive contacts 203 and 204 and the active layer 205. As shown in FIG. 2, the first and second tunneling layers 206 and 207 may collectively comprise a tunneling layer between the first and second conductive contacts 203 and 204 and the active layer 205, where the collective tunneling layer contacts (e.g., "is in direct contact with") each of the first and second conductive contacts 203 and 204 and the active layer 205. As shown in FIG. 2, the first tunneling layer 206 may be between the first conductive contact 203 and the active layer 205, such that the first tunneling layer 206 contacts both the first conductive contact 203 and the active layer 205. As further shown in FIG. 2, the second tunneling layer 207 may be between the second conductive contact 204 and the active layer 205, such that the second tunneling layer 207 contacts both the second conductive contact 204 and the active layer 205. The first and second tunneling layers 206 and 207 may respectively prevent direct electrical contacts between the first and second conductive contacts 203 and 204 and the active layer 205, and may generate a tunneling effect when a voltage over a critical value is applied thereto. Electrons and holes are moved to the active layer 205 due to the tunneling effect when a bias voltage is applied to the first conductive contact 203 and the second conductive contact 204. When the application of the bias voltage is discontinued, the electrons and holes are trapped in the active layer 205. Accordingly, the first and second tunneling layers 206 and 207 may provide a function to allow the electrons and holes to stay long in the active layer 205.

The first and second tunneling layers 206 and 207 may be formed of a material having an appropriate threshold voltage according to the magnitude of a bias voltage to drive the light-emitting device 200. The first and second tunneling layers 206 and 207 may include at least one of, for example, a Ti oxide, a Ta oxide, a Ni oxide, a Zn oxide, a W oxide, a Co oxide, a Nb oxide, a TiNi oxide, a LiNi oxide, an InZn oxide, a V oxide, a SrZr oxide, a SrTi oxide, a Cr oxide, a Fe oxide, a Cu oxide, a Hf oxide, a Zr oxide, an Al oxide, and a mixture thereof. Alternatively, for example, the first and second tunneling layers 206 and 207 may be formed of a two-dimensional material including hBN, black phosphorus, and graphene.

Referring to FIG. 2, the first conductive contact 203 and the second conductive contact 204 may be provided at both ends of the active layer 205. The first tunneling layer 206 may be provided between the first conductive contact 203 and the active layer 205. The second tunneling layer 207 may be provided between the second conductive contact 204 and the active layer 205. However, the present disclosure is not limited thereto, and the first conductive contact 203 and the second conductive contact 204 may be provided with the active layer 205 interposed therebetween, as in the light-emitting device 100 of FIG. 1. In this case, the first conductive contact 203 and the second conductive contact 204 may be provided with the active layer 205 interposed therebetween and not vertically covering the PC.

Figure 3:
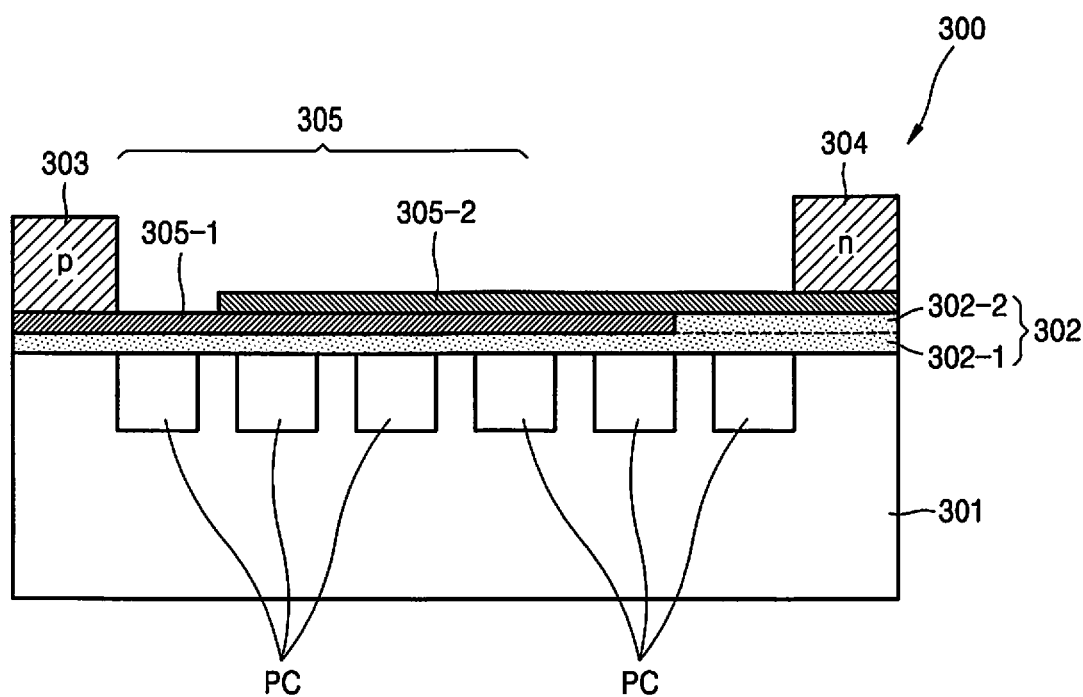
FIG. 3 is a schematic cross-sectional view of a light-emitting device according to some example embodiments.

FIG. 3 is a schematic cross-sectional view of a light-emitting device 300 according to some example embodiments. Referring to FIG. 3, the light-emitting device 300 may include a substrate 301 including the PC, an insulating layer 302, a first conductive contact 303, a second conductive contact 304, a first conductive active layer 305-1, and a second conductive active layer 305-2.

Since the characteristics and compositions of the substrate 301, the insulating layer 302, the first conductive contact 303, and the second conductive contact 304 are already described with regard to the example embodiments illustrated in FIG. 1, redundant descriptions thereof are omitted.

The first conductive active layer 305-1 and the second conductive active layer 305-2 may be formed of a two-dimensional material, like some example embodiments. As described herein, a two-dimensional material may be transition metal dichalcogenide (TMD). The transition metal TMD material may have a first conductive feature or a second conductive feature, according to a composition thereof. For example, while $MoS_2$ may have the second conductive feature, $WSe_2$ may have the first conductive feature. As the first conductive active layer 305-1 is formed of TMD having the first conductive feature, and the second conductive active layer 305-2 is formed of TMD having the second conductive feature, photoelectric conversion efficiency may be improved in a p-i-n structure.

Alternatively, for example, the first conductive active layer 305-1 and the second conductive active layer 305-2 are formed of the same two-dimensional material, but doped with different dopants. For example, the first conductive active layer 305-1 may be doped with a first conductive dopant, and the second conductive active layer 305-2 may be doped with a second conductive dopant. In this case, process efficiency of the light-emitting device 200 may be improved. However, the present disclosure is not limited thereto, and the first conductive active layer 305-1 and the second conductive active layer 305-2 may be formed of different two-dimensional materials, and may be formed by being doped with different dopants. In this case, since a difference between the first conductive feature and the second conductive feature of the first conductive active layer 305-1 and the second conductive active layer 305-2 is large, photoelectric conversion efficiency may be further improved.

In the structure of the light-emitting device 300 according to the present disclosure, the insulating layer 302 having an irregular thickness may be provided on the substrate 301. Restated, the insulating layer 302 may have a non-uniform thickness profile (e.g., the thickness profile of the insulating layer 302 may be not uniform). The insulating layer 302 may have different thicknesses at a position where the first conductive contact 303 is provided and at a position where the second conductive contact 304 is provided. For example, as shown in FIG. 3, the thickness of the insulating layer 302 at the position where the first conductive contact 303 is provided (e.g., a first thickness of a first portion of the insulating layer 302 that is between the first conductive contact 303 and the substrate 301 in a direction that is perpendicular to an upper surface of the substrate 301) may be less than that of the insulating layer 302 at the position where the second conductive contact 304 is provided (e.g., a second thickness of a second portion of the insulating layer 302 that is between the second conductive contact 304 and the substrate 301 in a direction that is perpendicular to the upper surface of the substrate 301). Restated, the second thickness of the second portion of the insulating layer 302 may be greater than the first thickness of the first portion of the insulating layer 302. However, the present disclosure is not limited thereto, and the opposite may also be possible.

Figure 4:
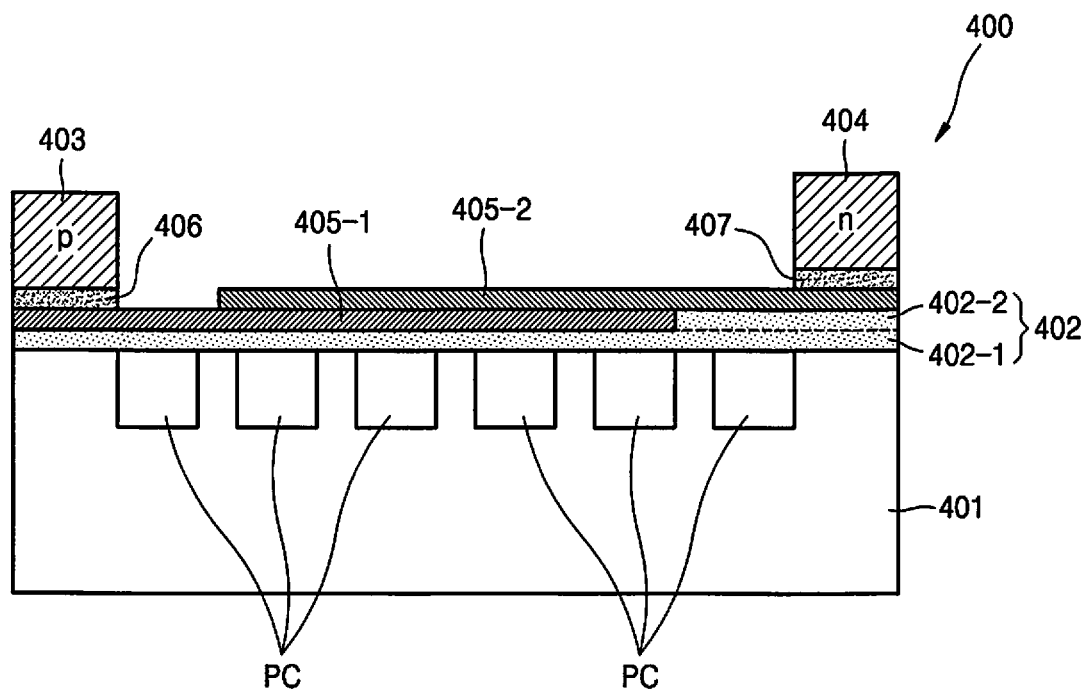
FIG. 4 is a schematic cross-sectional view of a light-emitting device according to some example embodiments.

The insulating layer 302 may include a first insulating layer 302-1 and a second insulating layer 302-2. The thickness of the first insulating layer 302-1 may be uniform. The thickness of the second insulating layer 302-2 may be uniform. As the insulating layer 302 is implemented by a layered structure of the first insulating layer 302-1 and the second insulating layer 302-2, a thickness profile may be controlled by a simple process. The first insulating layer 302-1 may be provided to cover an upper surface of the substrate 301. The second insulating layer 302-2 may be provided on at least a part of an upper surface of the first insulating layer 302-1. For example, as shown in FIG. 4, the second insulating layer 302-2 may be on a limited portion of an upper surface of the first insulating layer 302-1. The second insulating layer 302-2 may be located at a position where the first conductive contact 303 or the second conductive contact 304 is provided.

The first insulating layer 302-1 and the second insulating layer 302-2 may be formed of the same material or materials different from each other. The first insulating layer 302-1 and the second insulating layer 302-2 may be formed of any material having an insulation effect, but the present disclosure is not limited thereto.

The first conductive active layer 305-1 may be formed on the insulating layer 302. The first conductive active layer 305-1 may be provided to contact the first conductive contact 303 and not to contact the second conductive contact 304. For example, the first conductive active layer 305-1 may be provided on the first insulating layer 302-1 and in the same plane as the second insulating layer 302-2.

The second conductive active layer 305-2 may be formed on the insulating layer 302. The second conductive active layer 305-2 may be provided to contact the second conductive contact 304 and not to contact the first conductive contact 303. The second conductive active layer 305-2 may be provided to contact the first conductive active layer 305-1. A surface where the second conductive active layer 305-2 and the first conductive active layer 305-1 contact each other may be vertically located on the PC. The second conductive active layer 305-2 may be formed on the second insulating layer 302-2.

The light-emitting device 300 according to some example embodiments may have a vertical p-i-n structure because the first conductive active layer 305-1 and the second conductive active layer 305-2 form a vertically layered structure. Restated, the active layer 305 may include a layered structure, and the layered structure may include the first conductive active layer 305-1 and the second conductive active layer 305-2. When a bias voltage is applied to the first conductive contact 303 and the second conductive contact 304, holes may be moved to the first conductive active layer 305-1, and electrons may be moved to the second conductive active layer 305-2. The electrons and holes may be combined to each other on the surface where the first conductive active layer 305-1 and the second conductive active layer 305-2 contact each other, thereby forming light.

FIG. 4 is a schematic cross-sectional view of a light-emitting device 400 according to some example embodiments. Referring to FIG. 4, the light-emitting device 400 may include a substrate 401 including the PC, an insulating layer 402, a first conductive contact 403, a second conductive contact 404, a first conductive active layer 405-1, a second conductive active layer 405-2, a first tunneling layer 406, and a second tunneling layer 407. As shown in FIG. 4, the insulating layer 402 may include a first insulation layer 402-1 and a second insulation layer 402-2.

Since the characteristics and compositions of the substrate 401, the insulating layer 402, the first conductive contact 403, the second conductive contact 404, the first conductive active layer 405-1, and the second conductive active layer 405-2 are already described with regard to the example embodiments illustrated in FIG. 3, redundant descriptions thereof are omitted.

The tunneling layers 406 and 407 may be provided between the first and second conductive contacts 403 and 404 and the first and second conductive active layers 405-1 and 405-2. The tunneling layers 406 and 407 may prevent direct electric contact between the first and second conductive contacts 403 and 404 and the first and second conductive active layers 405-1 and 405-2, but may generate a tunneling effect when a voltage over a critical value is applied thereto. When a bias voltage is applied to the first and second conductive contacts 403 and 404, electrons and holes are moved to the first and second conductive active layers 405-1 and 405-2 due to the tunneling effect. When the application of the bias voltage is discontinued, the electrons and holes are trapped in the first and second conductive active layers 405-1 and 405-2. Accordingly, the first and second tunneling layers 406 and 407 may provide a function to allow the electrons and holes to stay long in the first and second conductive active layers 405-1 and 405-2. In detail, the first tunneling layer 406 may be provided between the first conductive contact 403 and the first conductive active layer 405-1. When the bias voltage is applied to the first conductive contact 403, holes are moved from the first tunneling layer 406 to the first conductive active layer 405-1. The second tunneling layer 407 may be provided between the second conductive contact 404 and the second conductive active layer 405-2. When the bias voltage is applied to the second conductive contact 404, electrons are moved from the second tunneling layer 407 to the second conductive active layer 405-2.

Figure 5:
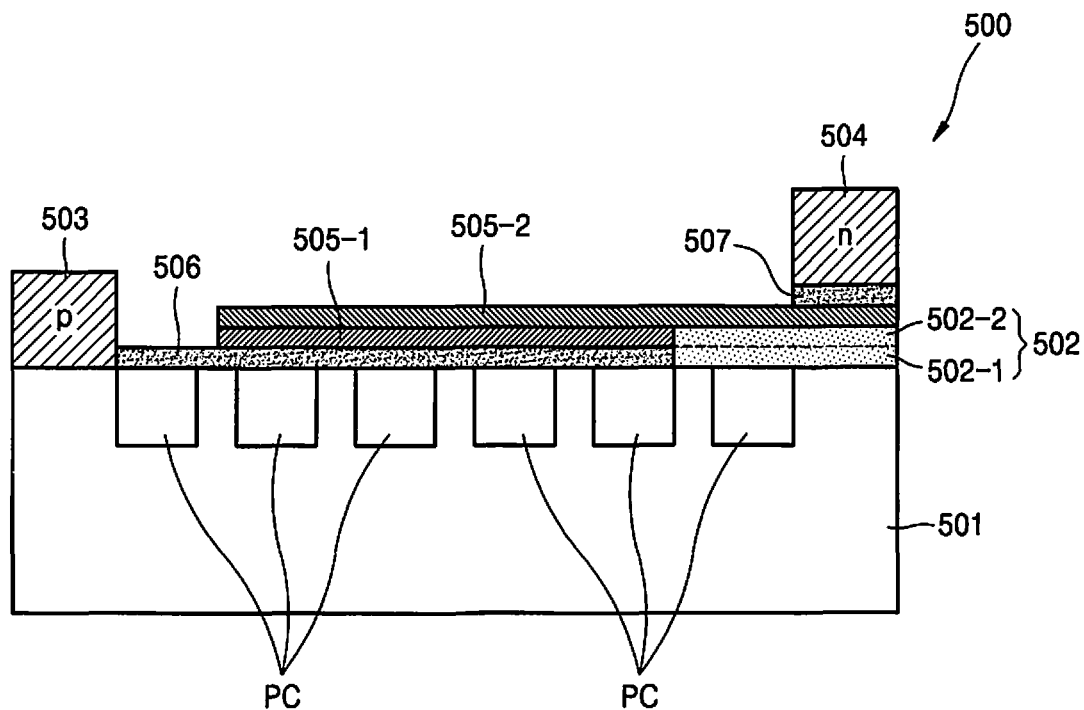
FIG. 5 is a schematic cross-sectional view of a light-emitting device according to some example embodiments.

FIG. 5 is a schematic cross-sectional view of a light-emitting device 500 according to some example embodiments. Referring to FIG. 5, the light-emitting device 500 may include a substrate 501 including the PC, an insulating layer 502, a first conductive contact 503, a second conductive contact 504, a first conductive active layer 505-1, a second conductive active layer 505-2, a first tunneling layer 506, and a second tunneling layer 507. As shown in FIG. 5, the insulation layer 502 may include a first insulation layer 502-1 and a second insulation layer 502-2.

The characteristics and compositions of the substrate 501, the insulating layer 502, the first conductive contact 503, the second conductive contact 504, the first conductive active layer 505-1, and the second conductive active layer 505-2 are already described with regard to the example embodiments illustrated in FIG. 3, redundant descriptions thereof are omitted.

In the structure of the light-emitting device 500 according to some example embodiments, the first conductive contact 503 and the first tunneling layer 506 may be provided to contact the substrate 501. The insulating layer 502 may be provided between the second conductive contact 504 and the substrate 501 such that the second conductive contact 504 and the substrate 501 do not contact each other. The first conductive contact 503 may be provided not to vertically cover the PC. The first tunneling layer 506 may be provided vertically on the PC. The first tunneling layer 506 may be located in the same plane as a first insulating layer 502-1. The first conductive active layer 505-1 may be provided on the first tunneling layer 506. The first conductive active layer 505-1 may be located in the same plane as a second insulating layer 502-2. The second conductive active layer 505-2 may be provided on the first conductive active layer 505-1, and may contact the first conductive active layer 505-1. The second conductive active layer 505-2 may be provided on the second insulating layer 502-2. The second tunneling layer 507 may be provided between the second conductive contact 504 and the second conductive active layer 505-2.

Figure 6:
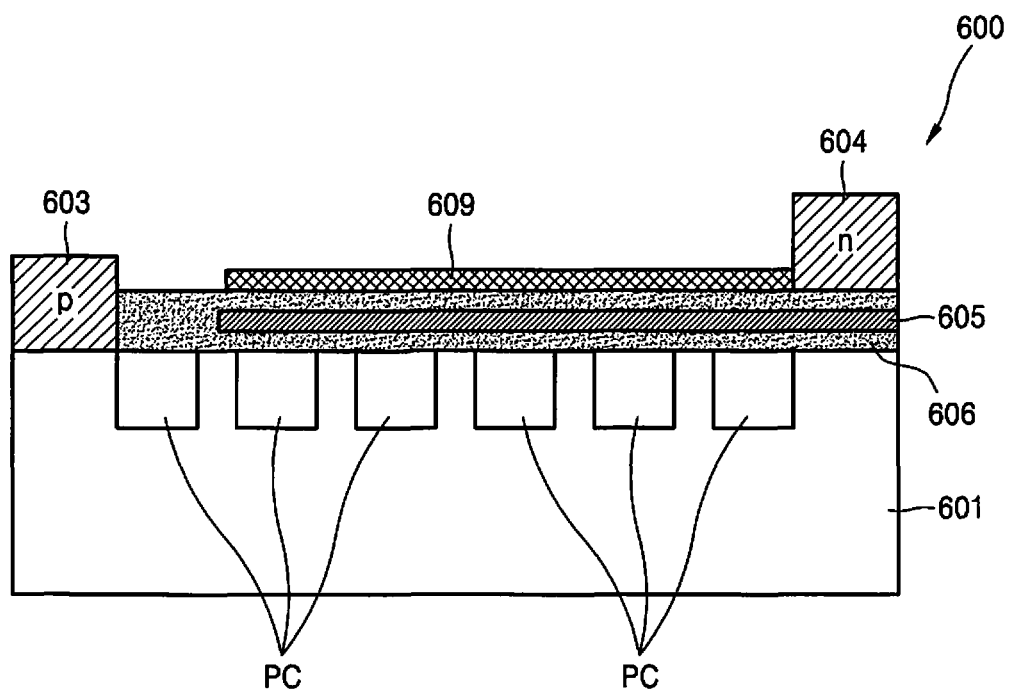
FIG. 6 is a schematic cross-sectional view of a light-emitting device according to some example embodiments.

FIG. 6 is a schematic cross-sectional view of a light-emitting device 600 according to some example embodiments. Referring to FIG. 6, the light-emitting device 600 may include a substrate 601 including the PC, a first conductive contact 603, a second conductive contact 604, an active layer 605, and a tunneling layer 606 surrounding the active layer 605.

Since the characteristics and compositions of the substrate 601, the first conductive contact 603, the second conductive contact 604, the active layer 605, and the tunneling layer 606 are already described in with regard to the example embodiments illustrated in FIG. 1, redundant descriptions thereof are omitted.

In the structure of the light-emitting device 600 according to some example embodiments, the first conductive contact 603 and the tunneling layer 606 may be provided to contact the substrate 601. The first conductive contact 603 may be provided not to vertically cover the PC. The tunneling layer 606 may simultaneously function as an insulating layer and as a tunneling function. The tunneling layer 606 may separate the second conductive contact 604 and the substrate 601 not to contact each other. The tunneling layer 606 may have a structure to surround the active layer 605. Restated, the tunneling layer 606 may cover at least two surfaces of an upper surface of the active layer 605, at least one side surface of the active layer 605, and a bottom surface of the active layer 605, such that the tunneling layer 606 at least partially surrounds the active layer 605. As shown in FIG. 6, the tunneling layer 606 may directly contact the surfaces of the active layer 605 that are covered by the tunneling layer 606. In some example embodiments, the tunneling layer 606 may not directly contact the surfaces of the active layer 605 that are covered by the tunneling layer 606. The second conductive contact 604 may be provided on the active layer 605 and the tunneling layer 606. As shown in FIG. 6, the second conductive contact 604 may be on (e.g., directly or not directly on) an upper surface of the tunneling layer 606, and the first conductive contact 603 may contact a side surface of the tunneling layer 606.

A transparent electrode 609 may be located vertically above the active layer 605, and may be provided to contact the second conductive contact 604. The transparent electrode 609 may contact the second conductive contact 604 and may be provided to extend in the horizontal direction (e.g., a direction that is parallel to an upper surface of the substrate 601 as shown in at least FIG. 6). The transparent electrode 609 may apply a bias voltage over a wide area vertically with respect to the active layer 605. The transparent electrode 609 may use graphene or a transparent conductive metal oxide such as an indium tin oxide (ITO), an indium zinc oxide (IZO), an aluminum zinc oxide (AZO), or a gallium zinc oxide (GZO). Alternatively, the transparent electrode 609 may be formed of a metal material, according to the wavelength range of light generated by the light-emitting device 600.

The first conductive contact 603 may be adjacent to the active layer 605 in the horizontal direction with the tunneling layer 606 interposed therebetween. The second conductive contact 604 may be adjacent to the active layer 605 in the vertical direction with the tunneling layer 606 interposed therebetween.

Figure 7:
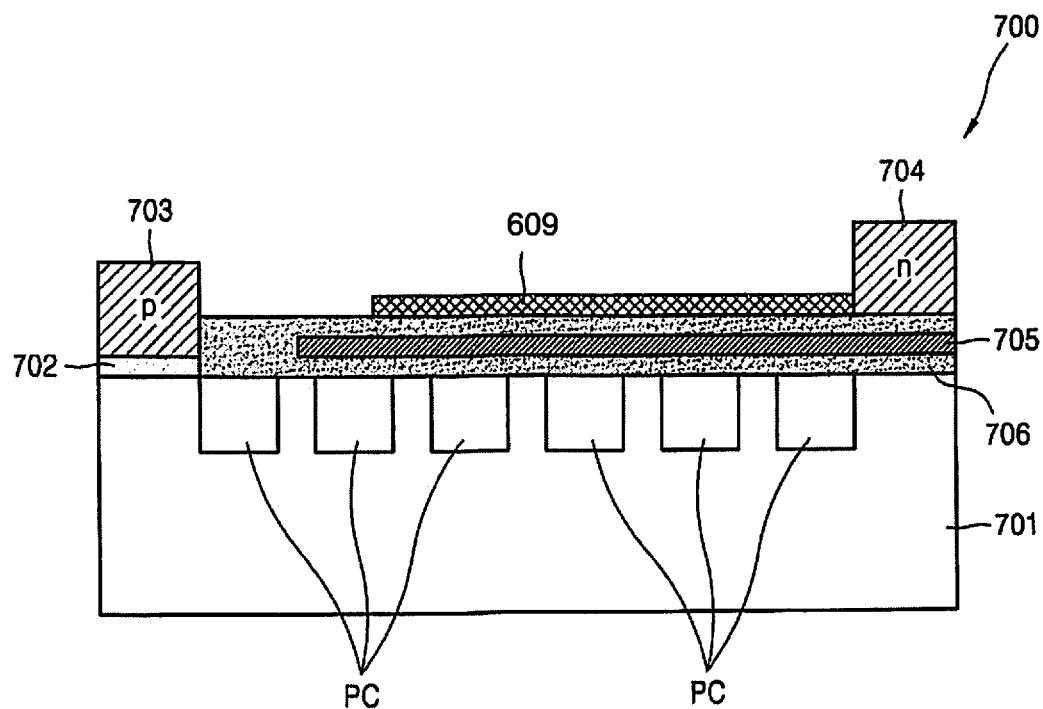
FIG. 7 is a schematic cross-sectional view of a light-emitting device according to some example embodiments.

FIG. 7 is a schematic cross-sectional view of a light-emitting device 700 according to some example embodiments. Referring to FIG. 7, the light-emitting device 700 may include a substrate 701 including the PC, a first conductive contact 703, a second conductive contact 704, an active layer 705, a tunneling layer 706 surrounding the active layer 705, and an insulating layer 702 provided between the first conductive contact 703 and the substrate 701.

Since the characteristics and compositions of the substrate 701, the first conductive contact 703, the second conductive contact 704, the active layer 705, the tunneling layer 706, and the insulating layer 702 are already described with regard to the example embodiments illustrated in FIG. 1, redundant descriptions thereof are omitted.

In the structure of the light-emitting device 700 according to some example embodiments, the insulating layer 702 may be provided between the substrate 601 and the first conductive contact 603. The tunneling layer 706 may be provided directly on the substrate 701. The active layer 705 may be provided vertically above the PC. The first conductive contact 703 may be provided not to vertically cover the PC. The tunneling layer 706 may simultaneously function as an insulating layer and as a tunneling function. The tunneling layer 706 may separate the second conductive contact 704 and the substrate 701 not to contact each other. The tunneling layer 706 may have a structure to surround the active layer 705. The second conductive contact 704 may be provided on the active layer 705 and the tunneling layer 706.

The first conductive contact 703 may be adjacent to the active layer 705 in the horizontal direction with the tunneling layer 706 interposed therebetween. The second conductive contact 704 may be adjacent to the active layer 705 in the vertical direction with the tunneling layer 706 interposed therebetween.

Figure 8:
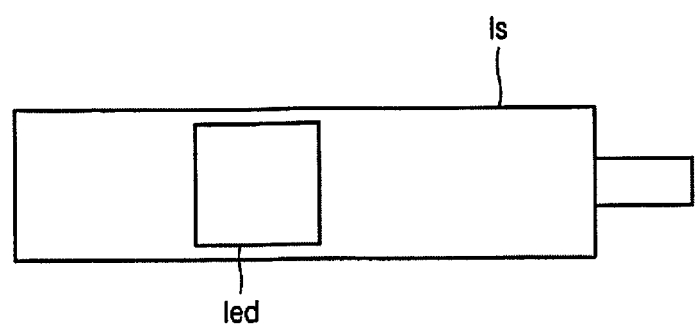
FIG. 8 schematically illustrates a laser light source according to some example embodiments.

FIG. 8 schematically illustrates a laser light source according to some example embodiments.

The light-emitting devices according to some example embodiments may be used for various electronic apparatuses. For example, the light-emitting devices according to some example embodiments may be configured to have an optical gain of 1 or more, and may be used in laser light sources. Referring to FIG. 8, a laser light source Is may include a light-emitting device (led) according to some example embodiments.

The light-emitting device according to the present disclosure may function as a gate, include the substrate including photonic cavity, amplify the intensity of light generated from the active layer, and narrow a wavelength range.

The light-emitting device according to the present disclosure may include the first conductive active layer and the second conductive active layer and improve photoelectric conversion efficiency.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A light-emitting device comprising:
   a substrate including a photonic cavity in a surface thereof;
   an active layer on the photonic cavity, the active layer including a two-dimensional material;
   a first conductive contact electrically connected to the active layer; and
   a second conductive contact electrically connected to the active layer,
   wherein the active layer does not include the photonic cavity;
   wherein the first conductive contact and the second conductive contact are above the substrate such that the light-emitting device is configured to sequentially form a first conductive region (p or n), a depletion layer region (i), and a second conductive region (n or p) with respect to the active layer in response to a bias voltage being applied to one conductive contact of the first conductive contact or the second conductive contact and another conductive contact of the first conductive contact or the second conductive contact being connected to ground (GND).

2. The light-emitting device of claim 1, further comprising:
   a tunneling layer between the first and second conductive contacts and the active layer, the tunneling layer contacting each of the first conductive contact, the second conductive contact, and the active layer.

3. The light-emitting device of claim 2, wherein the tunneling layer includes
   a first tunneling layer between the first conductive contact and the active layer, the first tunneling layer contacting both the first conductive contact and the active layer; and
   a second tunneling layer between the second conductive contact and the active layer, the second tunneling layer contacting both the second conductive contact and the active layer.

4. The light-emitting device of claim 2, wherein the tunneling layer at least partially surrounds the active layer.

5. The light-emitting device of claim 4, wherein
   the second conductive contact is on an upper surface of the tunneling layer, and
   the first conductive contact contacts a side surface of the tunneling layer.

6. The light-emitting device of claim 5, further comprising:
   a transparent electrode contacting the second conductive contact, the transparent electrode extending in a direction that is parallel to an upper surface of the substrate.

7. The light-emitting device of claim 4, further comprising:
   an insulating layer between the first conductive contact and the substrate.

8. The light-emitting device of claim 1, further comprising:
   an insulating layer between the active layer and the substrate, the insulating layer configured to electrically insulate the active layer from the substrate.

9. The light-emitting device of claim 8, wherein the insulating layer has a non-uniform thickness.

10. The light-emitting device of claim 9, wherein the insulating layer includes
    a first portion between the first conductive contact and the substrate, the first portion having a first thickness in a direction that is perpendicular to an upper surface of the substrate, and
    a second portion between the second conductive contact and the substrate, the second portion having a second thickness in the direction that is perpendicular to the upper surface of the substrate, the second thickness greater than the first thickness.

11. The light-emitting device of claim 10, wherein the insulating layer includes
    a first insulating layer on the substrate; and
    a second insulating layer on a limited portion of a surface of the first insulating layer.

12. The light-emitting device of claim 1, wherein the active layer includes
    a first conductive active layer at least partially between the first conductive contact and the substrate and not between the second conductive contact and the substrate; and
    a second conductive active layer at least partially between the second conductive contact the substrate and not between the first conductive contact and the substrate.

13. The light-emitting device of claim 12, wherein the active layer includes a layered structure, the layered structure including the first conductive active layer and the second conductive active layer.

14. The light-emitting device of claim 12, further comprising:
a tunneling layer, the tunneling layer including
a first tunneling layer between the first conductive contact and the first conductive active layer; and
a second tunneling layer between the second conductive contact and the second conductive active layer.

15. The light-emitting device of claim 1, further comprising:
a first tunneling layer on the photonic cavity, the first tunneling layer contacting the first conductive contact, wherein the active layer is on the first tunneling layer.

16. The light-emitting device of claim 15, wherein the active layer includes
a first conductive active layer on the first tunneling layer; and
a second conductive active layer stacked on the first conductive active layer, the second conductive active layer contacting the second conductive contact.

17. The light-emitting device of claim 16, further comprising:
an insulating layer on the substrate, the insulating layer contacting the first tunneling layer and the first conductive active layer at a side surface of the insulating layer, the insulating layer contacting the second conductive active layer at an upper surface of the insulating layer.

18. The light-emitting device of claim 15, further comprising:
a second tunneling layer between the second conductive contact and the active layer.

19. The light-emitting device of claim 1, wherein the substrate at least partially includes a conductive material.

20. The light-emitting device of claim 1, wherein the two-dimensional material is transition metal dichalcogenide (TMD).

21. The light-emitting device of claim 1, wherein the photonic cavity is configured to function as a gate electrode.

22. A laser light source including the light-emitting device of claim 1.

* * * * *